United States Patent [19]

Hakim

[11] 4,107,352

[45] Aug. 15, 1978

[54] CHEMICAL VAPOR DEPOSITION

[75] Inventor: Mohammad Javid Hakim, Burlington, Canada

[73] Assignee: Westinghouse Canada Limited, Hamilton, Canada

[21] Appl. No.: 843,869

[22] Filed: Oct. 20, 1977

[30] Foreign Application Priority Data

Jan. 13, 1977 [CA] Canada ................................. 269628

[51] Int. Cl.² ........................ B05D 3/14; C23C 11/00; C23C 13/00
[52] U.S. Cl. ................................. 427/50; 427/248 A; 427/249
[58] Field of Search ....................... 427/50, 249, 248 A

[56] References Cited

U.S. PATENT DOCUMENTS

| 2,901,381 | 8/1959 | Teal | 427/249 X |
|---|---|---|---|
| 2,962,388 | 11/1960 | Ruppert et al. | 427/249 |
| 3,642,522 | 2/1972 | Gass et al. | 427/249 |
| 3,684,585 | 8/1972 | Stroup et al. | 427/249 X |
| 3,900,592 | 8/1975 | Kennedy et al. | 427/249 X |
| 3,964,937 | 6/1976 | Post et al. | 427/249 X |

FOREIGN PATENT DOCUMENTS 952,383  8/1974  Canada .................................... 427/249

*Primary Examiner*—Michael R. Lusignan
*Attorney, Agent, or Firm*—Robert H. Fox; Edward H. Oldham

[57] ABSTRACT

This invention relates to an improved method of depositing thin layers of material on a substrate by means of chemical vapor deposition and particularly to addition of gas to the chemical vapor gases, which additional gas reduces conductive heat loss and improves the rate and quality of the coating. The invention has particular application to silicon carbide filaments and their coating with barrier layers of materials, such as hafnium carbide, hafnium nitride, etc., which are useful layers for inhibiting the migration of other materials into the silicon carbide when the silicon carbide filament is used as a reinforcing medium in a composite structure.

6 Claims, 3 Drawing Figures

CHEMICAL VAPOR DEPOSITION

BACKGROUND OF THE INVENTION

Chemical vapor deposition is a well known process for creating deposits of various composition, particularly metallic nitrides and carbides by means of passing gaseous mixture over a heated substrate causing the gaseous mixture to react and produce the desired substance on the substrate. Such a process is described in copending Canadian patent application No. 228,901 filed June 9, 1975 and assigned to the assignee of the instant application, which application discloses a process for depositing barrier layers on filaments.

Filaments have been proposed in the past for use in reinforcing composite structures and as described in the art, these filaments may be immersed in an alloy member and contribute to the high temperature strength of the resultant composite product. However, many of these filaments, for example, tungsten, silicon carbide, when immersed in such alloys, react with components of the alloys and, if exposed for long periods of time at high temperature, degrade due to migration of alloy constituents into the fibers. Certain coating materials will reduce this migration as described in Canadian application No. 228,901. It has been found however, that the process described in the foregoing application does not produce layers sufficiently thick for some applications, particularly when efforts are made to apply protective coatings on silicon carbide.

It appears that one of the causes of the poor rate of deposition of the barrier material on silicon carbide substrates, is the undesirable temperature distribution along the length of the substrate. In cases where the substrate is a fiber and where the heat is supplied by flowing electrical current through the fiber, it is evident that the temperature is a function of the $i^2r$ losses in the filament. It will also be evident that as coating proceeds, the fiber becomes effectively thicker and the $i^2r$ losses decrease Also, in the case where the barrier material produced on the surface of the fiber has a lower resistance per cube than the material of the fiber, then the thicker the barrier layer, the less the $i^2r$ losses. The sum of these effects therefore, is to decrease the temperature of the coated portion. In order that the rate of coating be uniform along the length of the substrate as it travels through the coating chamber in a continuous coating process, it would seem desirable that a suitable temperature be maintained substantially uniform along the whole length. In addition, the substrate obviously has limits to its maximum permissible temperature and if the temperature is not uniform along the length of the substrate, the maximum temperature location will operate as the limiting temperature for the system.

SUMMARY OF THE INVENTION

It has been found that the introduction of certain gases in addition to the gaseous precursors of the deposited material may determine the thermal boundary and the velocity boundary of the resulting mixture, whereby the Prandtl number is greater than one, but the Schmidt number is minimized. In a particular application of coatings to silicon carbide, it was found that the introduction of helium into the gaseous precursors resulted in a more uniform heat distribution and improved rate of deposition and an improved quality of deposition.

BRIEF DESCRIPTION OF THE DRAWINGS

FIG. 1 illustrates an apparatus for chemical vapor deposition of barrier materials. The silicon carbide filament 3 passes through a chamber 4, preferably formed of glass, entering and exiting through mercury seals 5 and 6 which are arranged to permit the silicon carbide filament to pass through the seal, but prevent gases from entering or leaving the chamber 4. The wire 3 passes centrally from right to left down the chamber through a coaxial tube 7 which is supported and sealed to the outer wall of chamber 4 by means of annular member 8. A metallic chloride generator 9 may consist simply of a chamber for retaining metallic particles of a suitable material such as hafnium and having an open end into which hydrogen chloride gas or chlorine gas may be introduced. The reaction products consist of chlorides of hafnium which flow out through a tube at the bottom of the reaction chamber designated 11. An inlet in tube 12 at 13 permits the introduction of a suitable reactive gas and hydrogen, for example, methane and hydrogen. A further inlet in tube 12 at 19 permits the introduction of a suitable gas which when mixed with the other gaseous precursors, produces a gaseous mixture having a Prandtl number greater than one and a minimal Schmidt number. The three inputs mixed at the end of tube 11 will flow into chamber 4, down the chamber 4 to its right hand end and into the coaxial tube 7, back through the chamber 4 to its far end and out through outlet 14 which is connected through a suitable trap to an arrangement for venting gases. In traversing the chamber 4, the gas flows over the filament 3. Inlet 20 is provided for the introduction of gas into the hot end of the chamber 4.

Figure 1:
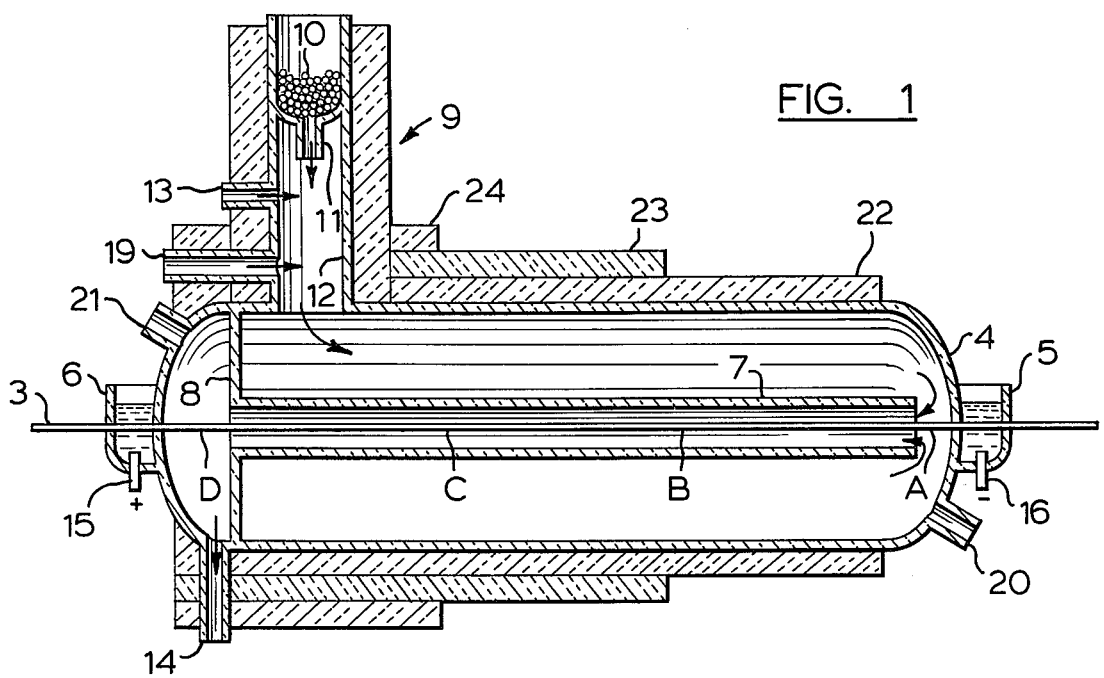
FIG. 1 illustrates an apparatus for chemical vapor deposition of barrier materials onto the surface of a filament.

Heating and insulating members cover the reactive areas to maintain suitable temperatures. The wire is maintained at a higher temperature by means of current passing through the wire between electrodes 15 and 16, which are immersed in the mercury seals. This current is adjusted to maintain the wire at the desired temperature.

Nitride coatings may be produced by substituting nitrogen for methane at inlet 13. Titanium coatings may be produced by direct introduction of titanium chloride which is commercially available to the generator 9, rather than production in situ which is preferred in the case of hafnium.

The essential features of the invention will become apparent with the discussion of the following tests which relate to the deposition of hafnium carbide on silicon carbide filaments.

Table 1 below, shows the result of depositing hafnium carbide coatings on a silicon carbide substrate. Tests 1 and 2 of Table 1 show that 100 cc. of hydrogen was introduced into the chamber at the hot end inlet 20 to improve the heat distribution along the length of the substrate.

Table 1

| Test | Flow in ml./min. H₂ Inlet 20 | H₂ Inlet 13 | CH₄ 13 | HCl | Volts | Amps | Speed (ft/min) | Thickness μm |
|---|---|---|---|---|---|---|---|---|
| 1 | 100 | 100 | 10 | 4 | 650 | .50 | 1 | 1.9 |
| 2 | 100 | 100 | 15 | 4 | 500 | .75 | 1 | 3.15 |

Test 1 shows for the substrate moving through the chamber at a rate of 1 ft/min a coating of 1.9 microns was deposited.

Tests 2 is a repeat coating with the output of Test 1 being passed through the chamber a second time and the total coating thickness deposited is seen to be 3.15 microns.

Tests 3 and 4 shown in Table 2 involve the introduction of helium into the cool end inlet 21 of the chamber. The deposition rates for Test 3 and 4 are shown to be 1.5 and 1.7 microns, respectively. It is evident that the introduction of helium into the cool end does not increase the deposition rate.

Table 2

| Test | Flow in ml./min. H₂ Inlet 20 | H₂ Inlet 13 | CH₄ | HCl | He Inlet 21 | Volts | Amps | Speed (1 ft/min) | Thickness μm |
|---|---|---|---|---|---|---|---|---|---|
| 3 | 100 | 100 | 15 | 4 | 250 | 640 | .5 | 1 | 1.5 |
| 4 | 100 | 100 | 15 | 4 | 250 | 550 | .45 | 1 | 1.7 |

| Test 4 Temperature profile | A | B | C | D |
|---|---|---|---|---|
| | 655° C | 679° C | 601° C | 517° C |

A further layer of insulating material, such as glass fiber, was applied from the midpoint to the cool end and a third layer over the last quarter at the cool end to improve the heat distribution. The result was as shown in Test 4.

The temperature profile shown in Table 2 is for Test 4. The temperature on the walls of the chamber was measured at four places, A, B, C and D as illustrated in FIG. 1 by means of four thermocouples. It is apparent that the temperature of the surface of the coated filament still peaked at B decreased at D.

Table 3 shows three tests, two of which relate to the introduction of helium into the reaction chamber, i.e. through inlet 19 of FIG. 1.

Test 5 shows that with the introduction of helium into the reaction chamber 6.5 microns of hafnium carbide was deposited on the silicon carbide substrate. The introduction of helium into the reaction chamber increased the deposition rate.

-continued

| Test | Temperature Profile A | B | C | D |
|---|---|---|---|---|
| 7 | 538° C | 639° C | 601° C | 559° C |

Tests 6 and 7 relate to the introduction of helium into the cool end of the chamber. The deposition rates are much lower and furthermore the introduction of additional hydrogen into the reaction chamber only decreases the deposition rate as shown in Test 7.

The temperature profiles show that introduction of helium into the reaction chamber (inlet 19) produces the preferred heat distribution as in Test 5.

The other test indicate that introduction of helium at the cool end (inlet 21) and increased hydrogen flow result in high temperature adjacent the hot end and low temperature at the exit.

The more even heat distribution along the surface of the substrate produced in Test 5 results in higher rates of deposition.

Figure 2:
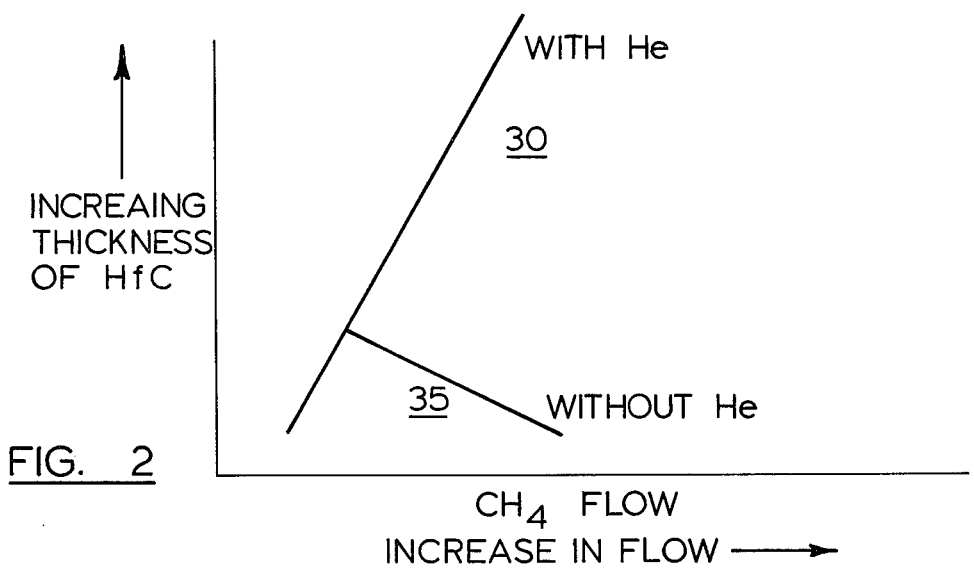
FIG. 2 shows the effect of concentration of methane gas in the precursors on the rate of deposition.
Figure 3:
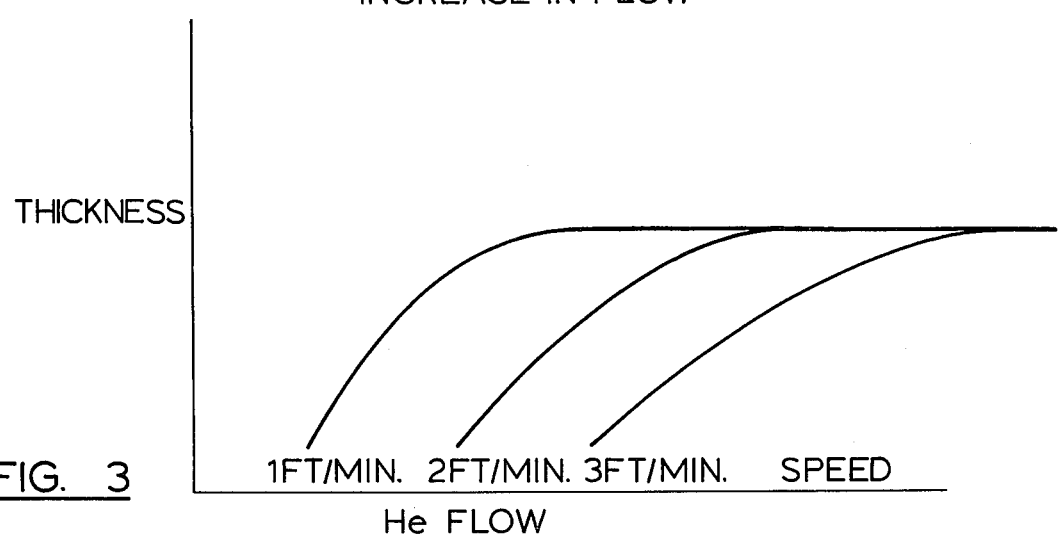
FIG. 3 shows the effect of helium flow at different substrate velocities through the chamber.

Further experiments were made to determine the effect of methane gas on the rate of deposition of hafnium carbide on a silicon carbide substrate. FIG. 2 illustrates the results of increasing the flow of methane gas into the reaction chamber. Curve 30 shows the rate of deposition increases substantially as the flow of methane gas increases when helium is present. Curve 35 shows that the rate of deposition decreases at a substantial rate as the flow of methane gas increases when helium is not present in the reaction chamber.

Tests 9 and 10 of Table 4 show the effect that increasing the speed at which the substrate moves through the chamber has on the thickness of deposit. The tests illustrate that increasing the speed reduces the thickness of deposit, but even at 2 ft/min. with sufficient methane flow and helium present a 6 μm deposit can be obtained.

Table 3

| Test | Flow in ml./min. H₂ Inlet 20 | H₂ Reaction Inlet 13 | CH₄ | HCl | He Inlet 21 | He Inlet 19 | Volts | Amps | Speed (1 ft/min) | Thickness μm |
|---|---|---|---|---|---|---|---|---|---|---|
| 5 | 100 | 100 | 37 | 5 | — | 200 | 580 | .52 | 1 | 6.5 |
| 6 | 100 | 100 | 37 | 5 | 200 | — | 570 | .53 | 1 | 3.5 |
| 7 | 100 | 300 | 37 | 5 | 200 | — | 580 | .54 | 1 | 2.75 |

| Test | Temperature Profile A | B | C | D |
|---|---|---|---|---|
| 5 | 524° C | 623° C | 604° C | 620° C |
| 6 | 533° C | 632° C | 492° C | 545° C |

Table 4

| Test | Flow in ml./min. H₂ Cool 20 | H₂ Reaction 13 | He Reaction 19 | CH₄ | HCl | Volts | Amps | Speed | Thickness μm |
|---|---|---|---|---|---|---|---|---|---|
| 9 | 100 | 100 | 300 | 30 | 5 | 605 | .5 | 3 ft/min. | 4.4 |
| 10 | 100 | 100 | 300 | 30 | 5 | 585 | .5 | 2 ft/min. | 6.0 |

| | Temperature Profile | | | |
|---|---|---|---|---|
| Test | A | B | C | D |
| 9 | 500° C | 621° C | 618° C | 527° C |
| 10 | 500° C | 622° C | 615° C | 520° C |

The foregoing description of various Tests has dealt solely with the production of a barrier layer on the silicon carbide filament electrically heated. It will be apparent however, that this invention has a much broader application. While the problem of heating was particularly severe in the case of an electrically heated silicon carbide filament, because of the fact that the resistance of silicon carbide is higher than that of the coating materials, the problem of proper heat distribution would exist in any case where the substrate is passed through a coating chamber. The effective deposition of material by the chemical vapor deposition process will depend upon maintaining the most effective temperature of the substrate without undue localized heating. As will be understood, localized heating may be detrimental to the character of the substrate. In addition, maintenance of a low Schmidt number will have an effect on the nature of the deposit produced. In order that the deposit be uniform and adhesive, it is desirable that nucleation occur on the surface of the substrate or as close thereto as possible, rather than in the gaseous media. If nucleation occurs in the gaseous media, the tendency is for the produced material to form a smoke or a particulate coating on the substrate, which coating may not be uniform or adhesiive.

The invention has also been described in the case of these examples with relation to helium, but it will be understood that the selection of the gas is such as to maximize the Prandtl number, minimize the Schmidt number and yet not introduce a gas which in any way will interfer with the chemical processes occurring. It will be understood, for example, that too high a concentration of the constituents may result in high supersaturation ratios and homogeneous nucleation and therefore some gases may not usefully be added. It would appear that ideally the gases added to the precursor mixture will be inert gases having suitable viscosities, thermal conductivities and heat transfer capacities.

The embodiments of the invention in which an exclusive property or privilege is claimed are defined as follows:

1. A method of producing a coating of metallic composition on an elongated conductive substrate by means of chemical vapor deposition wherein the substrate is heated to a predetermined temperature by passing an electric current longitudinally therethrough and exposed to a gaseous mixture of reactant materials suitable to produce said metallic composition at said predetermined temperature characterized in that gaseous material is added to said gaseous mixture to maximize the Prandtl number and minimize the Schmidt number of said gaseous mixture in the vicinity of said substrate and at said predetermined temperature.

2. An improved method of chemical vapor deposition as claimed in claim 1, characterized in that helium is included in the gaseous mixture used in the coating process.

3. The method as claimed in claim 2 wherein the quantity of helium in the mixture is selected to maximize the coating rate under the particular conditions of operation.

4. The method of coating a silicon carbide filament with a metallic compound selected from the class of carbides and nitrides of hafnium and titanium comprising, passing the filament through a coating chamber containing the gaseous precursors of the metallic compound and in addition, an inert gas which increases the Prandtl number and decreases the Schmidt number of the mixture within the coating chamber and passing current through the filament sufficient to heat the filament and cause deposition of the metallic compound on the filament without substantial degradation of the mechanical characteristics of the filament.

5. The method of claim 4 wherein the inert gas is helium.

6. The method of coating a silicon carbide filament with hafnium carbide comprising, passing the filament through a chamber containing a mixture of hafnium chlorides, methane and helium and passing an electric current through the portion of the filament within the chamber sufficient to heat the filament to a temperature sufficiently high as to cause deposition of hafnium carbide on the filament, but not so high as to cause appreciable mechanical degradation of the filament.

* * * * *